(12) United States Patent
Liu et al.

(10) Patent No.: US 12,224,289 B2
(45) Date of Patent: Feb. 11, 2025

(54) ARRAY SUBSTRATE INCLUDING NON-OVERLAPPING LINE SEGMENTS AND GATE LINES AND MANUFACTURING METHOD THEREFOR, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Ning Liu, Beijing (CN); Wei Song, Beijing (CN); Yingbin Hu, Beijing (CN); Qinghe Wang, Beijing (CN); Feng Zhang, Beijing (CN); Chongchong Liu, Beijing (CN); Bin Zhou, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 827 days.

(21) Appl. No.: 17/283,425

(22) PCT Filed: Jun. 19, 2020

(86) PCT No.: PCT/CN2020/097025
§ 371 (c)(1),
(2) Date: Apr. 7, 2021

(87) PCT Pub. No.: WO2020/253813
PCT Pub. Date: Dec. 24, 2020

(65) Prior Publication Data
US 2021/0343757 A1 Nov. 4, 2021

(30) Foreign Application Priority Data
Jun. 20, 2019 (CN) .......................... 201910536367.8

(51) Int. Cl.
*H01L 27/12* (2006.01)
*H01L 29/786* (2006.01)

(52) U.S. Cl.
CPC ...... *H01L 27/1244* (2013.01); *H01L 27/1248* (2013.01); *H01L 27/1251* (2013.01);
(Continued)

(58) Field of Classification Search
CPC ............. H01L 27/1244; H01L 27/1248; H01L 27/1251; H01L 27/1225; H01L 27/124;
(Continued)

(56) References Cited

U.S. PATENT DOCUMENTS 5,966,193 A * 10/1999 Zhang ................. H01L 27/1255
349/110
6,828,587 B2 * 12/2004 Yamazaki ......... H01L 21/02686
257/E27.113
(Continued)

FOREIGN PATENT DOCUMENTS

| CN | 202372736 | 8/2012 |
|---|---|---|
| CN | 103558722 | 2/2014 |

(Continued)

OTHER PUBLICATIONS

Chinese First Office Action (w/ English translation) for corresponding CN Application No. 201910536367.8, 11 pages.
(Continued)

*Primary Examiner* — Ida M Soward
(74) *Attorney, Agent, or Firm* — Dority & Manning, P.A.

(57) ABSTRACT

An array substrate includes gate lines, data lines and an insulating layer. The data lines all extend in a first direction,
(Continued)

and the gate lines all extend in a second direction, the first direction intersecting the second direction. A data line includes first line segments and second line segments that all extend in the first direction and are arranged alternately. The second line segments are disposed at a side of the gate lines proximate to the base, and the first line segments are disposed at a side of the gate lines away from the base. There is no overlap among orthographic projections of the first line segments on the base and orthographic projections of the gate lines on the base. The insulating layer includes first vias. In the first direction, any two adjacent first line segments are electrically connected to a second fine segment through at least two first vias.

13 Claims, 8 Drawing Sheets

(52) U.S. Cl.
  CPC ...... *H01L 27/127* (2013.01); *H01L 29/78666* (2013.01); *H01L 29/78672* (2013.01)
(58) Field of Classification Search
  CPC ........... H01L 27/1214; H01L 29/78633; H01L 29/78666; H01L 29/78672
  See application file for complete search history.

(56) References Cited

U.S. PATENT DOCUMENTS

| | | | | |
|---|---|---|---|---|
| 10,121,830 | B1* | 11/2018 | Li | ........................ H10K 59/38 |
| 2001/0007362 | A1* | 7/2001 | Ha | ..................... H01L 27/1255 |
| | | | | 438/149 |
| 2001/0014535 | A1* | 8/2001 | Yamazaki | ........... H01L 27/1274 |
| | | | | 438/689 |
| 2003/0136971 | A1 | 7/2003 | Rhee et al. | |
| 2007/0177067 | A1* | 8/2007 | Kim | ................. G02F 1/136227 |
| | | | | 349/43 |
| 2007/0296883 | A1* | 12/2007 | Kwon | ............... G02F 1/136286 |
| | | | | 349/43 |
| 2008/0210942 | A1 | 9/2008 | Yang | |
| 2010/0194697 | A1* | 8/2010 | Hotelling | .............. G06F 3/0412 |
| | | | | 345/55 |
| 2012/0086009 | A1 | 4/2012 | Shin et al. | |
| 2013/0037783 | A1* | 2/2013 | Lee | .................... H10K 59/1216 |
| | | | | 438/23 |
| 2015/0155311 | A1* | 6/2015 | Lee | ................... H01L 29/78606 |
| | | | | 257/43 |
| 2017/0025439 | A1* | 1/2017 | I | ........................ H01L 29/78696 |
| 2017/0176793 | A1 | 6/2017 | Choi et al. | |
| 2020/0273923 | A1 | 8/2020 | Liu et al. | |

FOREIGN PATENT DOCUMENTS

| | | | | |
|---|---|---|---|---|
| CN | 203503657 | | 3/2014 | |
| CN | 203503657 U | * | 3/2014 | |
| CN | 104932163 | | 9/2015 | |
| CN | 104932163 A | * | 9/2015 | ....... G02F 1/134309 |
| CN | 104966721 | | 10/2015 | |
| CN | 108803170 | | 11/2018 | |
| CN | 110190072 | | 8/2019 | |
| KR | 20100032187 A | * | 3/2010 | ......... H01L 27/1281 |

OTHER PUBLICATIONS

Chinese Second Office Action (w/ English translation) for corresponding CN Application No. 201910536367.8, 19 pages.

PCT International Search Report (w/ English translation) for corresponding PCT Application No. PCT/CN2020/097025, mailed on Sep. 23, 2020, 5 pages.

\* cited by examiner

E-E'

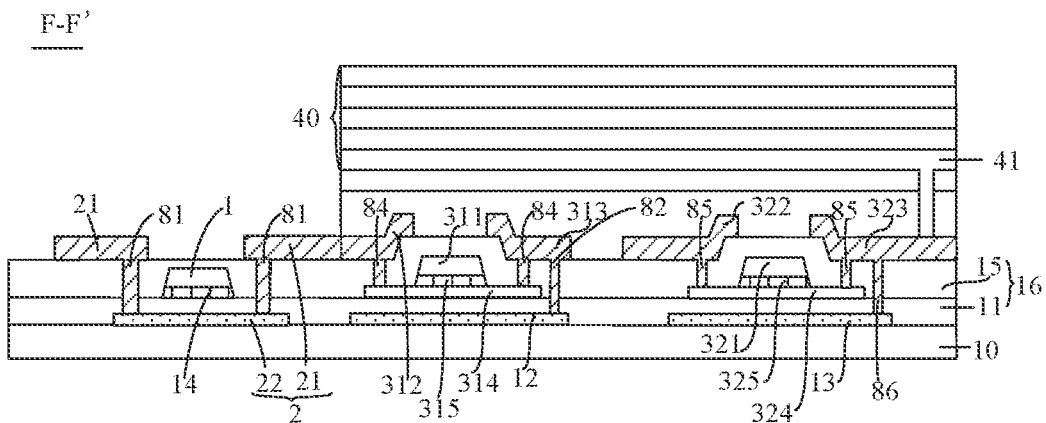

FIG. 15

```
                                    ┌─ 10
  Form a plurality of second line segments 22 on the base 10
                                    │
                                    ▼  ┌─ 20
  Form a plurality of gate lines 1 on the base 10 on which the
  plurality of second line segments 22 have been formed, the
  plurality of gate lines 1 all extending in the second direction X
                                    │
                                    ▼  ┌─ 30
  Form an insulating layer 16 on the base 10 on which the plurality
  of second line segments 22 have been formed, the insulating
  layer 16 including a plurality of first vias 81
                                    │
                                    ▼  ┌─ 40
  Form a plurality of first line segments 21 on the base 10 on which
  the insulating layer 16 has been formed
```

FIG. 16

ARRAY SUBSTRATE INCLUDING NON-OVERLAPPING LINE SEGMENTS AND GATE LINES AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN20201097025, filed on Jun. 19, 2020, which claims priority to Chinese Patent Application No. 201910536367.8, filed on Jun. 20, 2019, which are incorporated herein by reference in their entirety.

TECHNICAL FIELD

The present disclosure relates to the field of display technologies, and in particular, to an array substrate and a method of manufacturing the same, and a display device.

BACKGROUND

As a size and resolution of display panels continue to increase, a length and number of gate lines and data lines in the display panels also increase, resulting in an increased voltage drop (i.e., a voltage difference generated between a signal input terminal of a signal line and a distal end of the signal line opposite to the signal input terminal due to an inherent resistance of the signal line) of the gate lines and data lines.

SUMMARY

In one aspect, an array substrate is provided. The array substrate includes a base, a plurality of gate lines and a plurality of data lines disposed on the base, and an insulating layer disposed between the plurality of first line segments and the plurality of second line segments. The plurality of data lines all extend in a first direction, and the plurality of gate lines all extend in a second direction, the first direction intersecting the second direction. At least one of the plurality of data lines includes a plurality of first line segments and a plurality of second line segments that all extend in the first direction, the plurality of first line segments and the plurality of second line segments being arranged alternately. The plurality of second line segments are disposed at a side of the plurality of gate lines proximate to the base, and the plurality of first line segments are disposed at a side of the plurality of gate lines away from the base. Orthographic projections of the plurality of first line segments on the base are non-overlapping with orthographic projections of the plurality of gate lines on the base. The insulating layer includes a plurality of first vias. In the first direction, any two adjacent first line segments are electrically connected to a second line segment located between the two adjacent first line segments through at least two first vias.

In some embodiments, the base has a plurality of sub-pixel regions. The array substrate further includes a plurality of pixel circuits disposed on the base. Each pixel circuit is disposed in a sub-pixel region, and the pixel circuit is electrically connected to a gate line and a data line. The pixel circuit includes a first switching transistor. A first gate of the first switching transistor and the gate line are disposed in a same layer and made of a same material, and a first source and a first drain of the first switching transistor and the plurality of first line segments are disposed in a same layer and made of a same material.

In some embodiments, in the second direction, a width of the second line segment is greater than a width of the first line segment.

In some embodiments, the first switching transistor is a top-gate thin film transistor. The array substrate further includes a plurality of first metal light-shielding patterns disposed on the base. Each first metal light-shielding pattern is disposed at a side, proximate to the base, of the first switching transistor in a corresponding pixel circuit. An orthographic projection of a first active layer of the first switching transistor in the pixel circuit on the base is located within an orthographic projection of the first metal light-shielding pattern on the base. The plurality of second line segments and the plurality of first metal light-shielding patterns are disposed in a same layer and made of a same material, and the plurality of second line segments are insulated from the plurality of first metal light-shielding patterns.

In some embodiments, the insulating layer further includes a plurality of second vias, and one of the first source and the first drain of the first switching transistor is electrically connected to the first metal light-shielding pattern through at least one second via.

In some examples, in a thickness direction of the base, a thickness of the second line segment is equal to a thickness of the first metal light-shielding pattern.

In some embodiments, the array substrate further includes a plurality of pixel electrodes disposed on the base. Each pixel electrode is disposed in a sub-pixel region. The first source of the first switching transistor is electrically connected to the data line, and the first drain of the first switching transistor is electrically connected to the pixel electrode. The pixel electrode is disposed at a side of the first drain away from the base.

In some embodiments, the array substrate further includes a plurality of light-emitting devices disposed on the base. Each light-emitting device is disposed in a sub-pixel region, and the light-emitting device is connected to a corresponding pixel circuit.

In some embodiments, the pixel circuit further includes a driving transistor, the driving transistor being a top-gate thin film transistor. The array substrate further includes a plurality of second metal light-shielding patterns disposed on the base. Each second metal light-shielding pattern is disposed at a side, proximate to the base, of the driving transistor in a corresponding pixel circuit. An orthographic projection of a second active layer of the driving transistor on the base is located within an orthographic projection of the second metal light-shielding pattern on the base. The plurality of second line segments and the plurality of second metal light-shielding patterns are disposed in a same layer and made of a same material, and the plurality of second line segments are insulated from the plurality of second metal light-shielding patterns.

In some embodiments, the array substrate further includes a plurality of power lines. The plurality of power lines all extend in the first direction, and the pixel circuit is electrically connected to a power line. A power line of the plurality of power lines includes a plurality of third line segments and a plurality of fourth line segments that all extend in the first direction, the plurality of third line segments and the plurality of fourth line segments being arranged alternately. Orthographic projections of the plurality of third line segments on the base are non-overlapping with the orthographic projections of the plurality of gate lines on the base. The plurality of third line segments and the plurality of first line segments are disposed in a same layer and made of a same material, and the plurality of fourth line segments and the plurality of second line segments are disposed in a same layer and made of a same material. The insulating layer further includes the plurality of third vias; and in the first direction, any two adjacent third line segments are electrically connected to a fourth line segment located between the two adjacent third line segments through at least two third vias.

In some embodiments, in the second direction, a width of the fourth line segment is greater than a width of the third line segment.

In some embodiments, the power line is electrically connected to a second source of the driving transistor in the pixel circuit, and a second drain of the driving transistor is electrically connected to an anode of the light-emitting device.

In some embodiments, the insulating layer includes a buffer layer and an interlayer dielectric layer that are stacked on the base.

In another aspect, a display device is provided. The display device includes any one of the array substrates described above.

In yet another aspect, a method of manufacturing an array substrate is provided. The method includes: providing a base; forming a plurality of second line segments on the base, the plurality of second line segments being arranged into a plurality of columns of second line segments in a second direction, and each column of second line segments including a plurality of second line segments extending in a first direction and arranged at intervals, the first direction intersecting the second direction; forming a plurality of gate lines on the base on which the plurality of second line segments have been formed, the plurality of gate lines extending in the second direction; forming an insulating layer on the base on which the plurality of second line segments have been formed, the insulating layer including a plurality of first vias; and forming a plurality of first line segments on the base on which the insulating layer has been formed, orthographic projections of the plurality of first line segments on the base are non-overlapping with orthographic projections of the plurality of gate lines on the base; the plurality of first line segments being arranged into a plurality of columns of first line segments in the second direction, and each column of first line segments including first line segments extending in the first direction and arranged at intervals, and in the first direction, any two adjacent first line segments being electrically connected to a second line segment located between the two adjacent first line segments through at least two first vias; all the first line segments and all the second line segments that are electrically connected in each column constituting a single data line.

In some embodiments, after the plurality of second line segments are formed, the method of manufacturing the array substrate further includes: forming a plurality of pixel circuits on the base on which the plurality of second line segments have been formed, each pixel circuit being located in a sub-pixel region, and the pixel circuit including a first switching transistor. The plurality of gate lines and first gates of the first switching transistors are formed through a single patterning process, and the plurality of first line segments and first sources and first drains of the first switching transistors are formed through a single patterning process.

In some embodiments, the insulating layer includes a buffer layer and an interlayer dielectric layer. Forming the insulating layer, includes: forming a buffer film after the plurality of second line segments are formed and before the plurality of gate lines are formed; forming an interlayer dielectric film after the plurality of gate lines are formed; and patterning the interlayer dielectric film and the buffer film to form the interlayer dielectric layer and the buffer layer that include the plurality of first vias.

In some embodiments, forming the plurality of second line segments, includes: forming the plurality of second line segments and a plurality of first metal light-shielding patterns through a single patterning process, the plurality of second line segments being insulated from the plurality of first metal light-shielding patterns. An orthographic projection of a first active layer of the first switching transistor in the pixel circuit on the base is located within an orthographic projection of a corresponding first metal light-shielding pattern on the base.

In some embodiments, the insulating layer includes the buffer layer and the interlayer dielectric layer. Patterning the interlayer dielectric film and the buffer film to form the interlayer dielectric layer and the buffer layer that include the plurality of first vias, includes: patterning the dielectric film and the buffer film to form the interlayer dielectric layer and the buffer layer that include the plurality of first vias and a plurality of second vias. One of the first source and the first drain of the first switching transistor is electrically connected to the first metal light-shielding pattern through the second via.

BRIEF DESCRIPTION OF THE DRAWINGS

In order to describe technical solutions in the present disclosure more clearly, the accompanying drawings to be used in some embodiments of the present disclosure will be introduced below briefly. However, the accompanying drawings to be described below are merely accompanying drawings of some embodiments of the present invention, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

FIG. 15 is a schematic sectional view of the array substrate in FIG. 14 taken along the F-F' direction;

FIG. 16 is a flow diagram of a method of manufacturing an array substrate, in accordance with some embodiments of the present disclosure.

DETAILED DESCRIPTION

Figure 1:
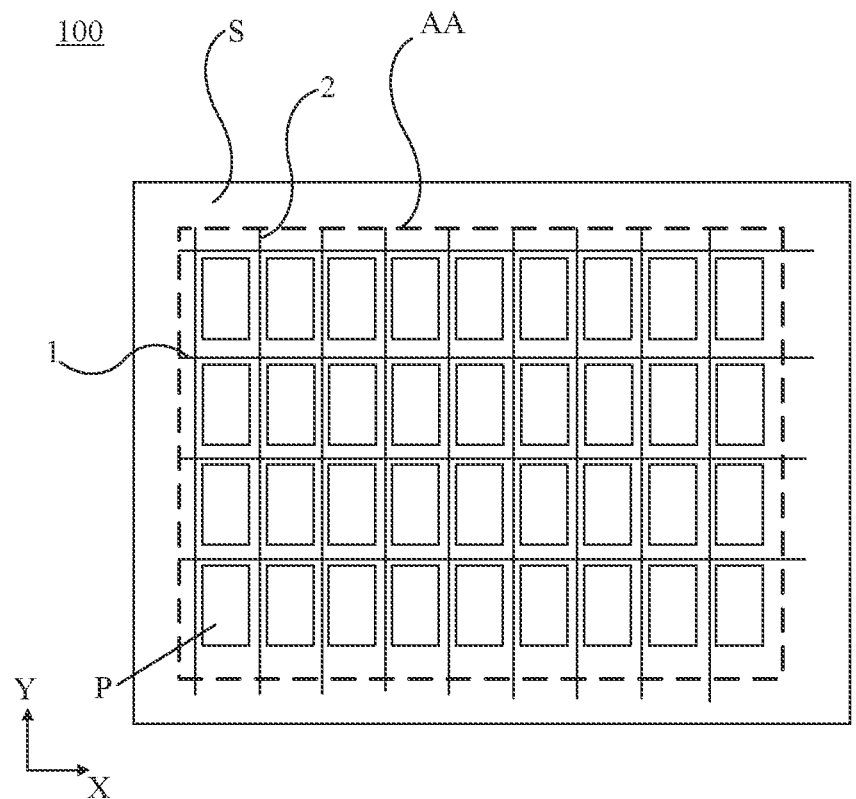
FIG. 1 is a schematic top view of a display panel, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, the term "comprise" and other forms thereof such as the third-person singular form "comprises" and the present participle form "comprising" throughout the description and the claims are construed as an open and inclusive meaning, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are used for descriptive purposes only, and are not to be construed as indicating or implying the relative importance or implicitly indicating the number of indicated technical features below. Thus, a feature defined with "first" or "second" may explicitly or implicitly include one or more of the features. In the description of the embodiments of the present disclosure, the term "a/the plurality of" means two or more unless otherwise specified.

The phrase "A and/or B" includes the following three combinations: only A, only B, and a combination of A and B.

The expression that C and D are disposed in a same layer and made of a same material means that C and D are located on the same carrying surface, and constitute a layer structure made by forming a film layer for forming specific patterns using the same film formation process, and then patterning the film layer through a patterning process using the same mask. The patterning process may include exposure, development and etching processes, and the specific patterns in the formed layer structure may be continuous or discontinuous, and these specific patterns may be at different heights or have different thicknesses.

The phase "at least one of A, B and C" has the same meaning as the phase "at least one of A, B or C", and both include the following combinations of A, B and C: only A, only B, only C, a combination of A and B, a combination of A and C, a combination of B and C, and a combination of A, B and C.

In the description of some embodiments, the term "connected" and derivatives thereof may be used. For example, the term "connected" may be used in the description of some embodiments to indicate that two or more components are in direct physical or electrical contact with each other. However, the term "connected" may also mean that two or more components are not in direct contact with each other, but still cooperate or interact with each other. The embodiments disclosed herein are not necessarily limited to the content herein.

Some embodiments of the present disclosure provide a display device. The display device includes, but is not limited to, a cellphone, a television, a tablet computer, a personal digital assistant (PDA), a vehicle-mounted computer or a display panel, FIG. 1 is a schematic top view of a display panel, in accordance with some embodiments of the present disclosure. As shown in FIG. 1, the display panel 100 has a display area AA and a peripheral area S.

Depending on different designs of the display panel 100, a specific position of the peripheral area S may be changed accordingly. For example, the peripheral area S surrounds the display area AA; or, the peripheral area S is located at one or more sides of the display area AA, but does not surround the display area AA.

A plurality of sub-pixels are provided in the display area AA, and each sub-pixel is located in a sub-pixel region P. The plurality of sub-pixels include at least sub-pixels of a first color, sub-pixels of a second color and sub-pixels of a third color. The first color, the second color and the third color are three primary colors (e.g., red, green and blue).

FIG. 1 illustrates an example in which the plurality of sub-pixels are arranged in an array. As shown in FIG. 1, sub-pixels arranged in a line along a horizontal direction X (e.g., a row direction) are referred to as sub-pixels in a same row, and sub-pixels arranged in a line along a vertical direction Y (e.g., a column direction) are referred to as sub-pixels in a same column.

In some examples, the sub-pixels in the same row may be connected to a gate line 1, and the sub-pixels in the same column may be connected to a data line 2.

The display panel 100 may be, for example, a liquid crystal display panel or a self-luminous display panel.

In some embodiments, the display panel 100 is a liquid crystal display panel.

Figure 2:
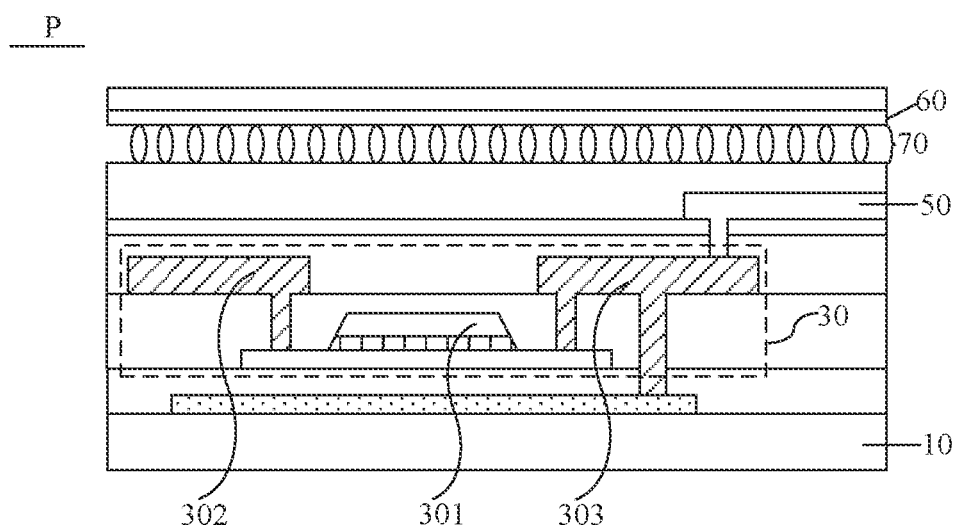
FIG. 2 is a schematic structural diagram of a sub-pixel, in accordance with some embodiments of the present disclosure.

In this case, as shown in FIG. 2, the sub-pixel region P is provided therein with a pixel circuit 30, a pixel electrode 50 and a common electrode 60. The pixel circuit 30 includes a first switching transistor.

In some examples, a gate 301 of the first switching transistor is connected to the gate line 1, a source 302 of the first switching transistor is connected to the data line 2, and a drain 303 of the first switching transistor is connected to the pixel electrode 50 (as shown in FIG. 2).

In some other examples, the gate 301 of the first switching transistor is connected to the gate line 1, the source 302 of the first switching transistor is connected to the pixel electrode 50, and the drain 303 of the first switching transistor is connected to the data line 2.

As shown in FIG. 2, the pixel electrode 50 and the common electrode 60 are configured to apply an electric field to a liquid crystal molecule layer 70 in the sub-pixel region P, so that liquid crystal molecules in the liquid crystal molecule layer 70 rotates under an action of the electric field. It will be noted that FIG. 2 only exemplarily illustrates a case where the common electrode 60 and the pixel electrode 50 are disposed on two opposite sides of the liquid crystal layer molecule layer 70. Of course, the common electrode 60 and the pixel electrode 50 may also be disposed at a same side of the liquid crystal molecule layer 70.

In some examples, a color filter pattern is further provided in the sub-pixel region P.

It can be understood that a color filter pattern located in the first color sub-pixel is of the first color, a color filter pattern located in the second color sub-pixel is of the second color, and a color filter pattern located in the third color sub-pixel is of the third color.

In some other embodiments, the display panel 100 is a self-luminous display panel.

Figure 3:
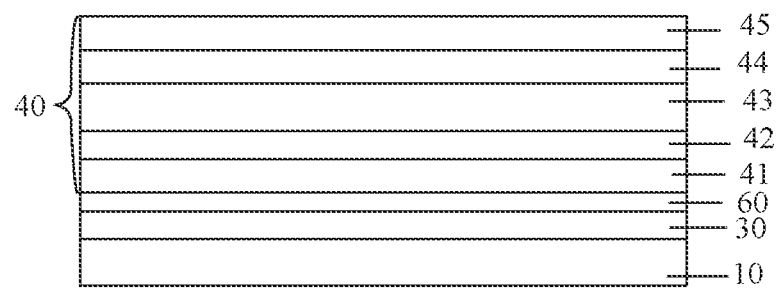
FIG. 3 is a schematic structural diagram of another sub-pixel, in accordance with some embodiments of the present disclosure.

In this case, as shown in FIG. 3, the sub-pixel region P is provided therein with a pixel circuit 30 and a light-emitting device 40 that are located on a base 10.

The pixel circuit 30 includes at least a first switching transistor, a driving transistor, and a capacitor (C for short).

Figure 6:
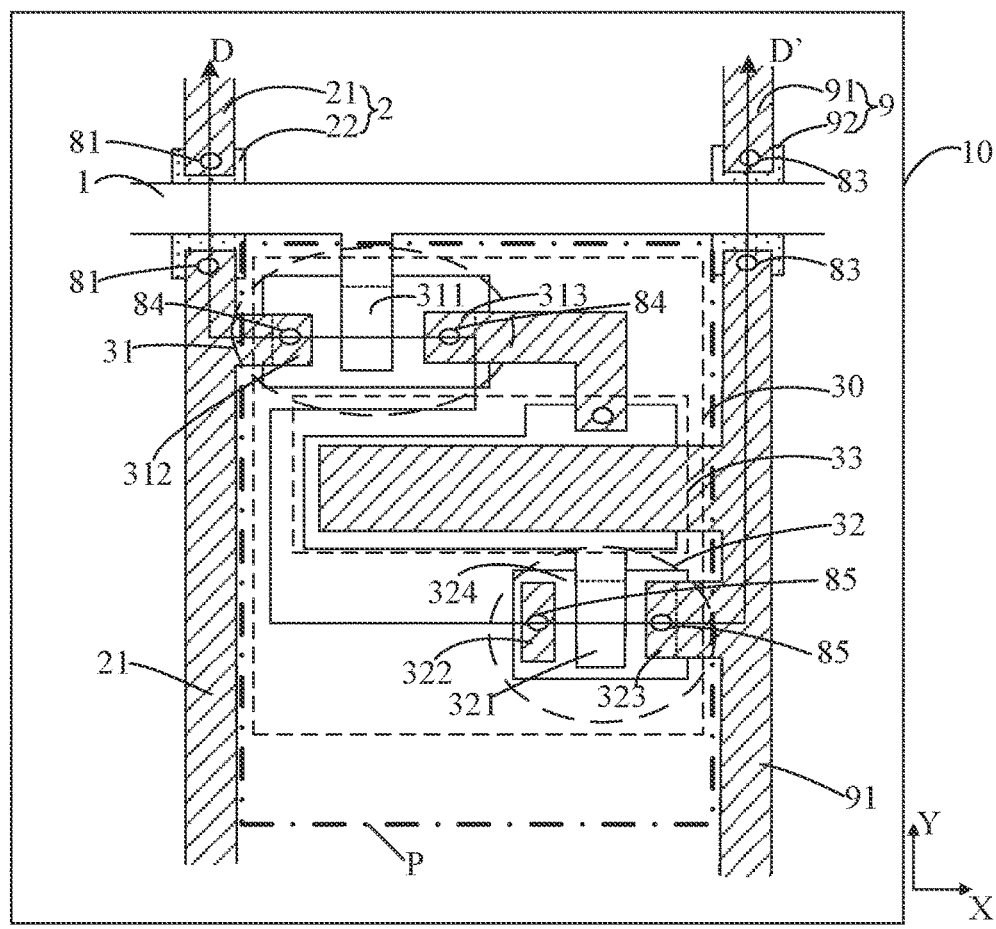
FIG. 6 is a schematic top view of another array substrate, in accordance with some embodiments of the present disclosure.

For example, referring to FIG. 6, the pixel circuit 30 may be a pixel circuit of a 2T1C structure. That is, the pixel circuit 30 includes two thin film transistors (TFTs for short) and one capacitor 33. The two TFTs include a switching TFT (e.g., the first switching transistor 31 in FIG. 6) and a driving TFT (e.g., the driving transistor 32 in FIG. 6).

Of course, in addition to the 2T1C structure, the pixel circuit 30 may also be of other structures, for example, a 3T1C structure (that is, the pixel circuit 30 includes three TFTs and one capacitor), a 5T1C structure (that is, the pixel circuit 30 includes five TFTs and one capacitor), or a 7T1C structure (that is, the pixel circuit 30 includes seven TFTs and one capacitor). That is to say, the pixel circuit 30 may include at least two TFTs and at least one capacitor. The at least two TFTs include at least one switching TFT and one driving TFT.

As shown in FIG. 3, the light-emitting device 40 includes a cathode 45, an anode 41, and a light-emitting functional layer located between the cathode 45 and the anode 41.

In an example where the light-emitting device 40 is an organic light-emitting diode (OLE©), as shown in FIG. 3, the light-emitting functional layer includes an organic light-emitting layer 43, a hole transport layer 42 located between the organic light-emitting layer 43 and the anode 41, and an electron transport layer 44 located between the organic light-emitting layer 43 and the cathode 45.

In some examples, the light-emitting functional layer further includes a hole injection layer disposed between the hole transport layer 42 and the anode 41, and/or an electron injection layer disposed between the electron transport layer 44 and the cathode 45.

It will be noted that FIG. 3 only exemplarily shows a schematic structural diagram of the self-luminous display panel, and does not show an electrical connection relationship between the pixel circuit 30 and the light-emitting device 40. The embodiments of the present disclosure do not limit an electrical connection mode of the pixel circuit 30 and the light-emitting device 40, which may be selected according to the structure of the pixel circuit 30.

In some embodiments, the light-emitting device 40 emits white light, and a color filter pattern is further provided in the sub-pixel region P.

A light-emitting type of the light-emitting device 40 may be a top emission type (that is, light emitted from the light-emitting device 40 exits from a side of the light-emitting device away from the base 10) or a bottom emission type (that is, light emitted from the light-emitting device 40 passes through the base 10 and exits).

In some examples, the light-emitting device 40 is a top emission light-emitting device, and the color filter pattern is located on a side of the light-emitting device 40 away from the pixel circuit 30.

In some other examples, as shown in FIG. 3, the light-emitting device 40 is a bottom emission light-emitting device, and the color filter pattern 60 is located on a side of the light-emitting device 40 proximate to the pixel circuit 30.

Regardless of the type of the display panel, it always includes an array substrate.

As shown in FIGS. 4 to 7, some embodiments of the present disclosure provide an array substrate 200, which includes a base 10, and a plurality of gate lines 1 and a plurality of data lines 2 disposed on the base 10. The plurality of data lines 2 all extend in a first direction Y, and the plurality of gate lines all extend in a second direction X. The first direction intersects the second direction.

Figure 4:
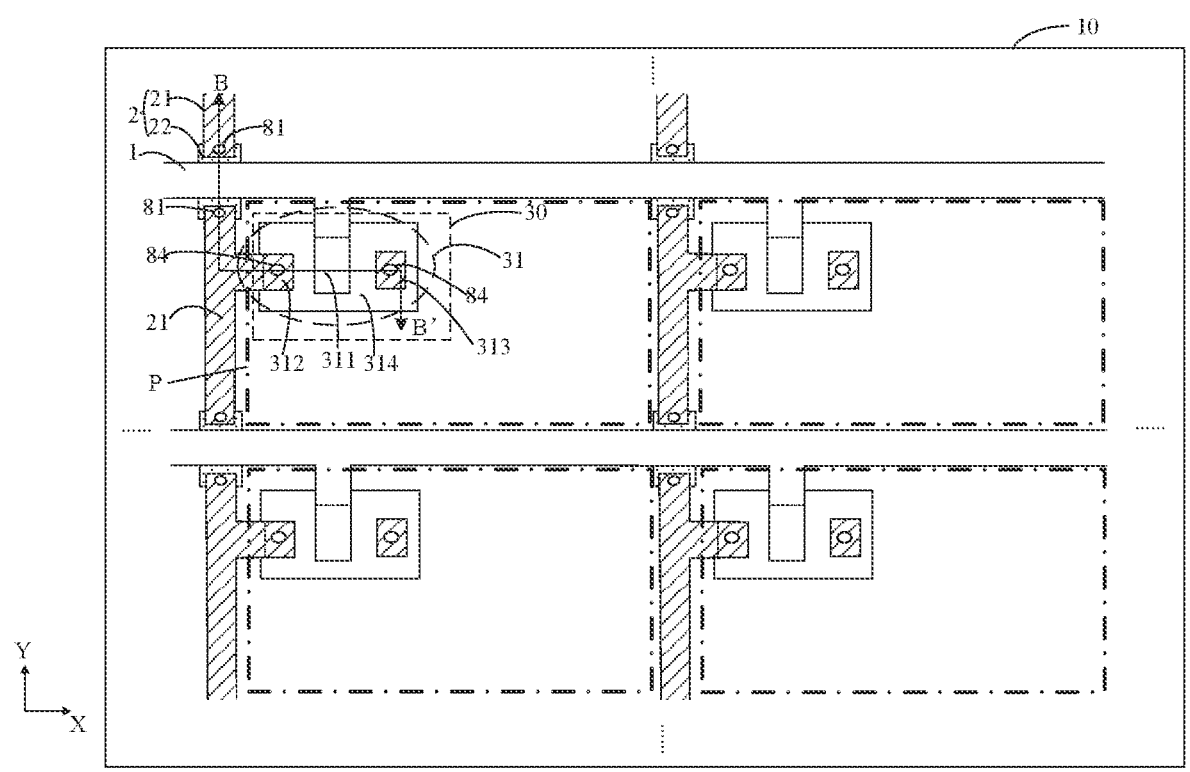
FIG. 4 is a schematic top view of an array substrate, in accordance with some embodiments of the present disclosure.

In some examples, as shown in FIG. 4, the first direction is perpendicular to the second direction.

As shown in FIGS. 4 to 7, at least one of the plurality of data lines 2 includes a plurality of first line segments 21 and a plurality of second line segments 22 that all extend in the first direction Y. The plurality of first line segments 21 and the plurality of second line segments 22 are arranged alternately. For example, each data line 2 includes a plurality of first line segments 21 and a plurality of second line segments 22 that all extend in the first direction Y, and the plurality of first line segments 21 and the plurality of second line segments 22 are arranged alternately.

As shown in FIGS. 4 to 7, the plurality of second line segments 22 in the data line 2 are disposed at a side of the plurality of gate lines 1 proximate to the base 10, and the plurality of first line segments 21 in the data line 2 are disposed at a side of the plurality of gate lines 1 away from the base 10. There is no overlap among orthographic projections of the plurality of first line segments 21 on the base 10 and orthographic projections of the plurality of gate lines 1 on the base 10. An orthographic projection of each second line segment 22 on the base 10 overlaps with an orthographic projection of a corresponding gate line 1 on the base 10.

Figure 5:
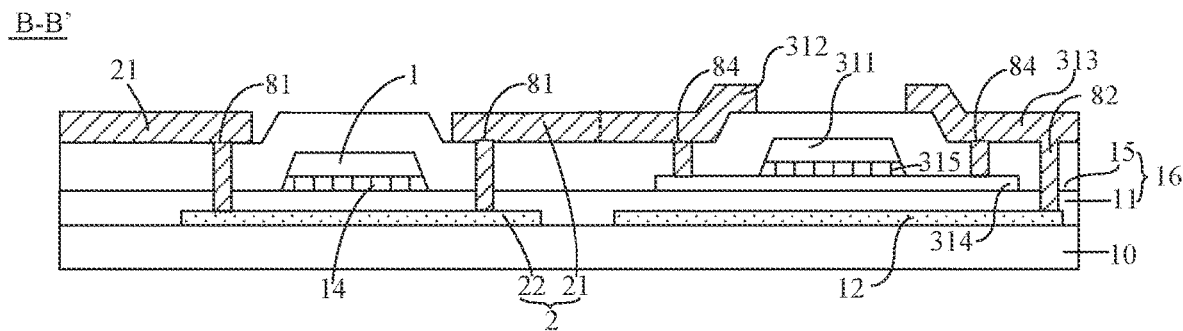
FIG. 5 is a schematic sectional view of the array substrate in FIG. 4 taken along the B-B' direction.
Figure 7:
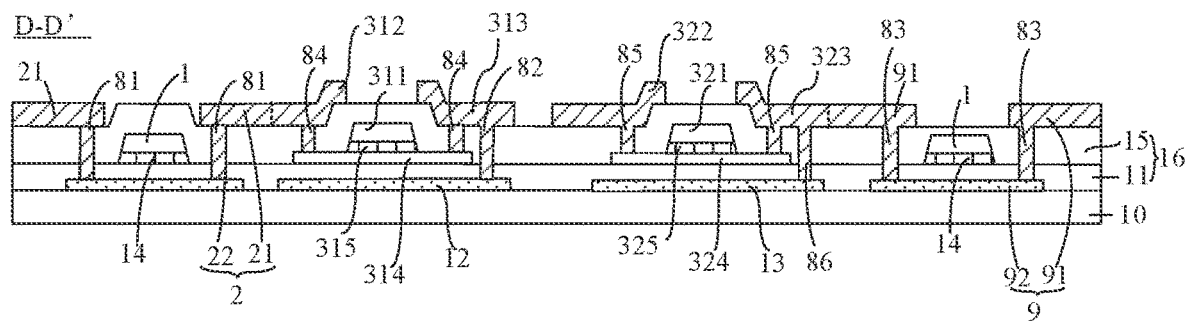
FIG. 7 is a schematic sectional view of the array substrate in FIG. 6 taken along the D-D' direction.

As shown in FIGS. 5 and 7, the array substrate 200 further includes an insulating layer 16 disposed between the plurality of first line segments 21 and the plurality of second line segments 22. The insulating layer 16 includes a plurality of first vias 81. In the first direction, any two adjacent first line segments 21 are electrically connected to a second line segment 22 located between the two first line segments 21 through at least two first vias 81.

For example, as shown in FIGS. 4 and 6, any two adjacent first line segments 21 are electrically connected to a second line segment 22 located between the two first line segments 21 through two first vias 81. The two first vias 81 are located at two opposite sides of a corresponding gate line 1 in the first direction. An orthogonal projection of one of the first vias 81 on the base 10 overlaps with orthographic projections of one of the two first line segments 21 and the second line segment 22 on the base 10, and an orthogonal projection of another first via 81 on the base 10 overlaps with orthographic projections of another first line segment 21 and the second line segment 22 on the base 10.

In some embodiments, as shown in FIGS. 5 and 7, the insulating layer 16 includes a buffer layer 11 and an interlayer dielectric layer 15 that are stacked on the base 10.

The buffer layer 11 is disposed between the plurality of second line segments 22 and the plurality of gate lines 1, so that the plurality of second line segments 22 are insulated from the plurality of gate lines 1.

The buffer layer 11 may be of a single-layer or multi-layer structure. For example, the buffer layer 11 is of a single-layer structure, and a material of the buffer layer 11 may include, for example, silicon oxide ($SiO_x$) or silicon nitride ($SiN_x$). For another example, the buffer layer 11 is of a two (or morel-layer structure, and the buffer layer 11 includes at least one $SiO_x$ layer and at least one $SiN_x$ layer.

The interlayer dielectric layer 15 is disposed between the plurality of gate lines 1 and the plurality of first line segments 21.

The interlayer dielectric layer 15 may be of a single-layer or multi-layer structure. For example, the interlayer dielectric layer 15 is of a single-layer structure, and a material of the interlayer dielectric layer 15 may include, for example, $SiO_x$ or $SiN_x$. For another example, the interlayer dielectric layer 15 is of a two (or more)-layer structure, and the interlayer dielectric layer 15 includes at least one $SiO_x$ layer and at least one $SiN_x$ layer.

Figure 8:
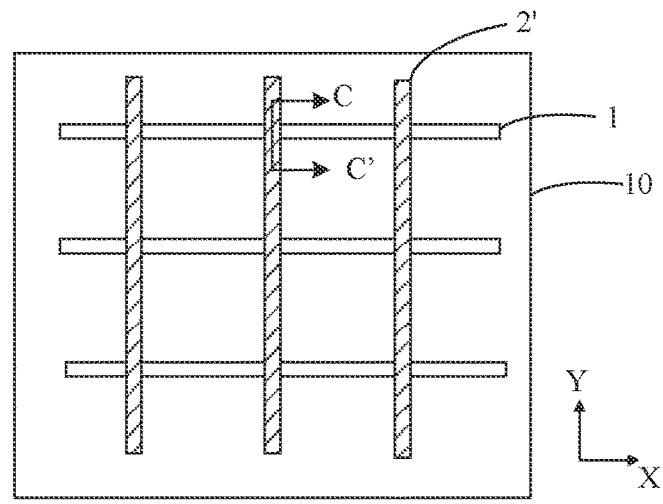
FIG. 8 is a schematic top view of an array substrate in the related art.
Figure 9:
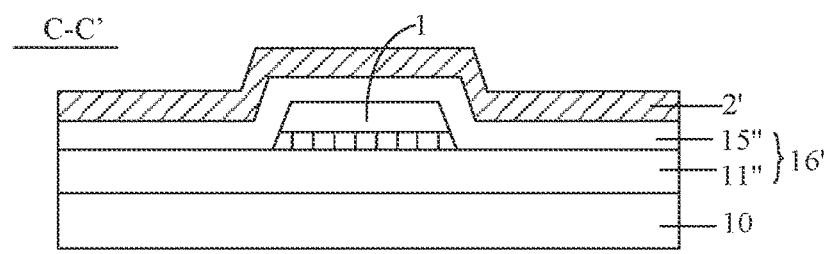
FIG. 9 is a schematic sectional view of the array substrate in FIG. 8 taken along the C-C' direction.

Referring to FIGS. 8 and 9, in the related art, a plurality of gate lines 1 intersect with a plurality of first data lines 2', and the first data lines 2" are located at a side of the gate lines 1 away from the base 10. An isolation layer 16' is provided between the gate lines 1 and the base 10, and the isolation layer 16' includes a first interlayer dielectric layer 15" and a first buffer layer 11".

Since the gate line 1 is very long, especially in a large-size display panel, it may cause a serious voltage drop problem.

Since a magnitude of voltage drop is inversely proportional to a cross-sectional area of a wire ($\Delta U = L(\sigma^*S)$, in which $\Delta U$ is the voltage drop of the wire, L is a length of the wire, a is a conductivity of a material of the wire, and S is the cross-sectional area of the wire), it can be seen that, in a case where a material with a high conductivity a is used as a material of the gate line, a purpose of reducing the voltage drop may be achieved by increasing the cross-sectional area of the gate line. Based on this, on a premise of not reducing an aperture ratio of the display panel, a thickness of the gate line 1 in a thickness direction of the base may be increased. In this case, due to a large thickness of the gate line 1, there will be a large level difference between portions of the first interlayer dielectric layer 15" that cover the gate lines 1 and portions of the first interlayer dielectric layer 15" that do not cover the gate lines 1. It can be seen that, the greater the thickness of the gate line 1, the greater the level difference of the first interlayer dielectric layer 15", The large level difference may cause a thickness of the first interlayer dielectric layer 15" to be non-uniform. As a result, the portions of the first interlayer dielectric layer 15" that cover the gate lines 1 may be very thin, or some gate lines 1 may not be covered by the first interlayer dielectric layer 15", thereby reducing a ratio at which the first interlayer dielectric layer 15" covers the gate lines 1.

In this case, when the first data lines 2' are formed on the first interlayer dielectric layer 15", due to the large level difference of the first interlayer dielectric layer 15", in one aspect, there is a risk that the first data lines 2' may be disconnected. In another aspect, since the gate lines 1 and the first data lines 2' are disposed on two opposite sides of the first interlayer dielectric layer 15" and the thickness of the first interlayer dielectric layer 15" is non-uniform, around positions where the gate lines 1 and the first data lines 2' overlap, metal particles in the gate lines 1 may easily pass through portions of the first interlayer dielectric layer 15" that are very thin and drift to the first data lines 2' due to electro-static discharge (ESD). Consequently, a problem of data gate short (DGS, i.e., a short circuit between a data line and a gate line) may occur between the first data line 2' and the gate line 1.

In addition, due to limitations of process conditions, there are particles in film layer(s) between the gate lines 1 and the base 10. Therefore, a surface of the gate line 1 away from the base 10 is uneven, thereby causing the first interlayer dielectric layer 15" to be uneven. Thus, the level difference of the first interlayer dielectric layer 15" and a level difference of the first data line 2' are further increased, and a pass rate of the product is further reduced.

In the array substrate 200 provided in the embodiments of the present disclosure, the data line 2 includes the plurality of first line segments 21 and the plurality of second line segments 22 in the first direction. The plurality of first line segments 21 are located at the side of the gate lines 1 away from the base 10, and the plurality of second line segments 22 are located at the side of the gate lines 1 proximate to the base 10. The insulating layer 16 includes the plurality of first vias 81, so that in the first direction, any two adjacent first line segments 21 may be electrically connected to the second line segment 22 located between the two adjacent first line segments 21 through at least two first vias 81, so that the plurality of first line segments 21 and the plurality of second line segments 22 that are electrically connected in the first direction may form a single data line 2. Since there is no overlap among the orthographic projections of the plurality of first line segments 21 on the base 10 and the orthographic projections of the gate lines 1 on the base 10, and any two adjacent first line segments 21 are connected through the second line segment 22 located at the side of the gate lines 1 proximate to the base 10 (that is, a portion of the data line 2 that overlaps with the gate line 1 passes between the gate line 1 and the base 10), the data line 2 will not cross the gate line 1 from above. Thus, in the array substrate 200 provided in the embodiments of the present disclosure, problems such as disconnection of the data line and DGS caused by the large thickness of the gate line 1 or the particles in the film layers may be effectively avoided, and the pass rate of the product may be effectively improved.

In some embodiments, as shown in FIG. 4, the base 10 has a plurality of sub-pixel regions P, The array substrate 200 further includes a plurality of pixel circuits 30, and each pixel circuit 30 is disposed in a sub-pixel region P. The pixel circuit 30 is electrically connected to a gate line 1 and a data line 2.

As shown in FIGS. 4 and 5, the pixel circuit 30 includes a first switching transistor 31. The first switching transistor 31 includes a first gate 311, a first source 312, a first drain 313, a first active layer 314, and a first gate insulating pattern 315.

The first gate 311 of the first switching transistor 31 and the gate line 1 connected to the pixel circuit 30 are disposed in a same layer and made of a same material, and the first source 312 and the first drain 313 of the first switching transistor 31 and the first line segment 21 are disposed in a same layer and made of a same material. An orthographic projection of the first gate 311 on the base 10 is within a range of an orthographic projection of the first active layer 314 of the first switching transistor 31 on the base 10.

In some examples, as shown in FIG. 5, the first switching transistor 31 is a top-gate thin film transistor. In this case, the first active layer 314 of the first switching transistor 31 is located at a side of the first gate 311 proximate to the base 10. The interlayer dielectric layer 15 is located between a layer where the first source 312 and the first drain 313 are located and the first gate 311. The first source 312 and the first drain 313 are electrically connected to the first active layer 314 of the first switching transistor 31 through first connection vias 84 that penetrate the interlayer dielectric layer 15.

In some other examples, the first switching transistor 31 is a bottom-gate thin film transistor. In this case, the first active layer 314 of the first switching transistor 31 is located at a side of the first gate 311 away from the base 10. The interlayer dielectric layer 15 is located between the layer where the first source 312 and the first drain 313 are located and the first active layer 314. The first source 312 and the first drain 313 are electrically connected to the first active layer 314 of the first switching transistor 31 through first connection vias 84 that penetrate the interlayer dielectric layer 15. Herein, the interlayer dielectric layer 15 may also be referred to as an etching barrier layer.

For example, the material of the first gates 311 and the gate lines 1 includes at least one of copper (Cu), aluminum (Al), molybdenum (Mo), titanium (Ti), chromium (Cr), tungsten (W), and other elemental metals. That is, the first gates 311 and the gate lines 1 may be made of one of the above elemental metals, or made of an alloy composed of two or more of the above elemental metals.

The material of the first line segments 21, and the first sources 312 and the first drains 313 of the first switching transistors 31 may include copper (Cu), aluminum (Al), or other elemental metals.

In some embodiments, as shown in FIG. 4, in the second direction X (i.e., the row direction), a width of the second line segment 22 is greater than a width of the first line segment 21. In this way, a pass rate of electrical connection between the first line segment 21 and the second line segment 22 may be ensured.

In some embodiments, as shown in FIG. 5, the first switching transistor 31 is a top-gate thin film transistor. The array substrate 200 further includes a plurality of first metal light-shielding patterns 12 disposed on the base 10. Each first metal light-shielding pattern 12 is disposed at a side, proximate to the base 10, of a first switching transistor 31 in a corresponding pixel circuit. Since the active layer of the transistor is sensitive to light, and electrical properties of the transistor may easily change when the transistor is exposed to light, it is arranged that the orthographic projection of the first active layer 314 of the first switching transistor 31 on the base 10 is located within an orthographic projection of the first metal light-shielding pattern 12 on the base 10, so that the first metal light-shielding pattern 12 may block light that travels toward the first active layer 314.

The plurality of second line segments 22 and the plurality of first metal light-shielding patterns 12 are disposed in a same layer and made of a same material, and the plurality of second line segments 22 are insulated from the plurality of first metal light-shielding patterns 12. In some examples, in a thickness direction of the base 10, a thickness of the second line segment 22 is equal to a thickness of the first metal light-shielding pattern 12. In this way, it may be possible to reduce a level difference of the buffer layer 11 located on a side of the second line segments 22 and the first metal light-shielding patterns 12 as much as possible, and thus prevent the pass rate of the display panel from being affected by a large level difference of the buffer layer 11.

A material of the second line segments 22 and the first metal light-shielding patterns 12 includes Mo, Al, or other metal materials having a light-shielding effect. A material of the first active layer 314 includes, for example, indium gallium zinc oxide (IGZO), indium gallium oxide (IGO), indium tin zinc oxide (ITZO), aluminum zinc oxide (AlZnO), zinc oxide (ZnO), or gallium zinc oxide (GZO), or other metal oxides.

Optionally, as shown in FIG. 5, the insulating layer 16 further includes a plurality of second vias 82, and one of the first source 312 and the first drain 313 of the first switching transistor 31 is electrically connected to the first metal light-shielding pattern 12 through at least one second via 82.

Figure 10:
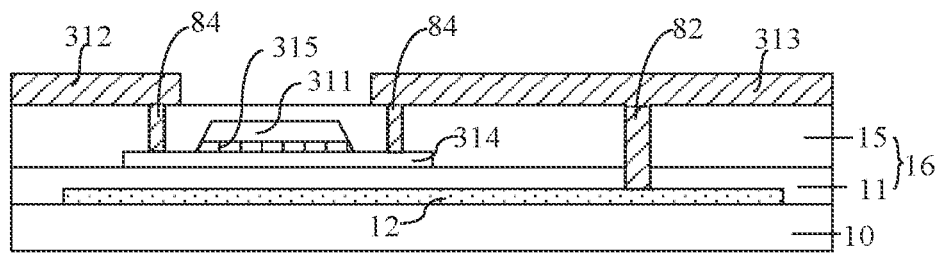
FIG. 10 is a schematic structural diagram of yet another array substrate, in accordance with some embodiments of the present disclosure.

In some examples, as shown in FIGS. 5 and 10, the first drain 313 of the first switching transistor 31 is electrically connected to the first metal light-shielding pattern 12 through a second via 82.

Figure 11:
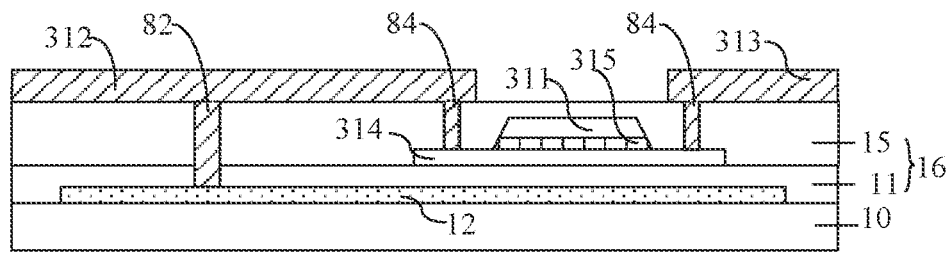
FIG. 11 is a schematic structural diagram of yet another array substrate, in accordance with some embodiments of the present disclosure.

In some other examples, as shown in FIG. 11, the first source 312 of the first switching transistor 31 is electrically connected to the first metal light-shielding pattern 12 through a second via 82.

The first source 312 or the first drain 313 of the first switching transistor 31 is electrically connected to the first metal light-shielding pattern 12, and the first source 312 and the first drain 313 are also electrically connected to the first active layer 314 of the first switching transistor 31. In this way, it may be possible to make induced charges at the first metal light-shielding pattern 12 flow to the first source 312 and the first drain 313, avoiding an influence on the first switching transistor 31. In addition, it may be ensured that the first active layer 314, the first source 312, and the first drain 313 of the first switching transistor 31 are at a same potential, thereby improving an electrical stability of the first switching transistor 31 and improving the electrical properties of the first switching transistor 31.

Figure 12:
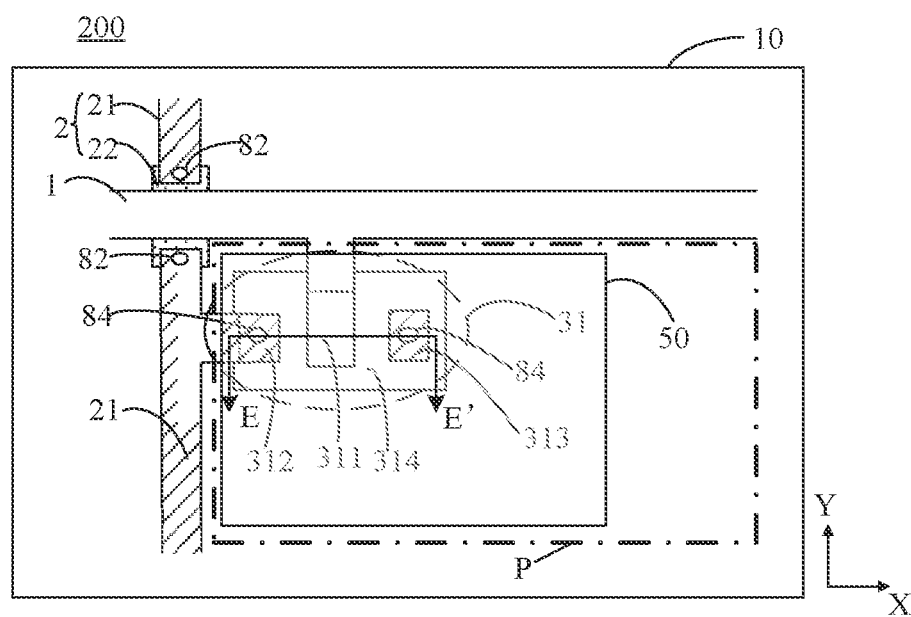
FIG. 12 is a schematic top view of yet another array substrate, in accordance with some embodiments of the present disclosure.
Figure 13:
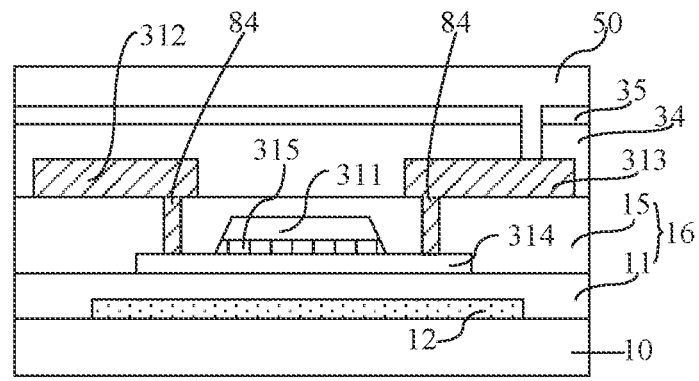
FIG. 13 is a schematic sectional view of the array substrate in FIG. 12 taken along the E-E' direction.

In some embodiments, as shown in FIGS. 12 and 13, the array substrate 200 further includes a plurality of pixel electrodes 50 disposed on the base 10, and each pixel electrode 50 is disposed in a sub-pixel region P.

As shown in FIGS. 12 and 13, the first drain 313 of the first switching transistor 31 is electrically connected to the pixel electrode 50. The pixel electrode 50 is disposed at a side, away from the base 10, of the first drain 313 of the first switching transistor 31.

In some examples, the pixel electrode 50 may be made of indium tin oxide (ITO).

In some embodiments, as shown in FIGS. 12 and 13, the array substrate 200 further includes a passivation layer 34 and an organic insulating layer 35 that are disposed between the pixel electrodes 50 and the first drains 313 of the first switching transistors 31. The pixel electrode 50 may be electrically connected to the first drain 313 of the first switching transistor 31 through a third connection via that penetrates the organic insulating layer 35 and the passivation layer 34.

In some examples, a material of the passivation layer 34 may include an inorganic material, such as silicon nitride; and a material of the organic insulating layer 35 may include an organic polymer material, such as polymethyl methacrylate (PMMA).

Figure 14:
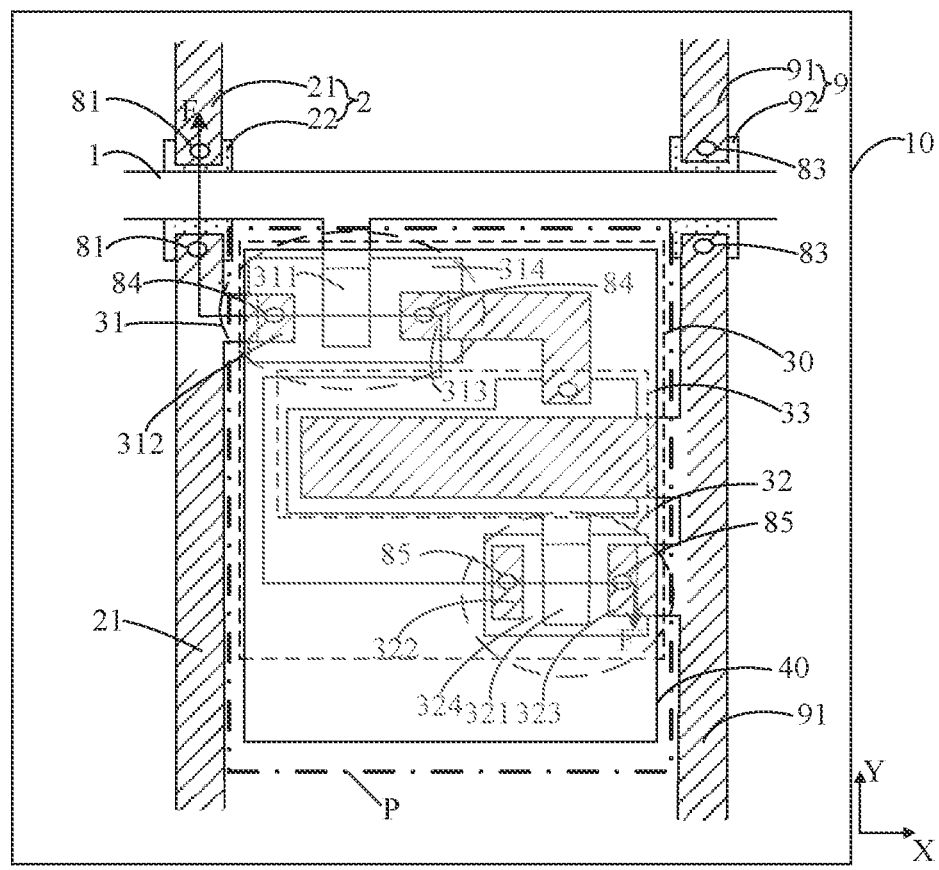
FIG. 14 is a schematic top view of yet another array substrate, in accordance with some embodiments of the present disclosure.

In some embodiments, as shown in FIGS. 14 and 15, the array substrate 200 further includes a plurality of light-emitting devices 40 disposed on the base 10. Each light-emitting device 40 is disposed in a sub-pixel region P, and the light-emitting device 40 is connected to a pixel circuit 30 located in the sub-pixel region P.

In some embodiments, as shown in FIG. 6, the pixel circuit 30 further includes a driving transistor 32, and the driving transistor 32 is a top-gate thin film transistor.

As shown in FIG. 7, the driving transistor 32 includes a second active layer 324, a second gate insulating pattern 325 and a second gate 321 that are disposed on a side of the second active layer 324 away from the base 10, and a second source 322 and a second drain 323. The second source 322 and the second drain 323 are each in contact with the second active layer 324 of the driving transistor 32 through at least one second connection via 85 in the interlayer dielectric layer 15. A material of the second active layer 324 includes, for example, IGZO, IGO, ITZO, AlZnO, ZnO, GZO, or other metal oxides.

As shown in FIGS. 6 and 7, the array substrate 200 further includes a plurality of second metal light-shielding patterns 13 disposed on the base 10. Each second metal light-shielding pattern 13 is disposed at a side, proximate to the base 10, of a driving transistor 32 in a corresponding pixel circuit 30. An orthographic projection of a second active layer 324 of the driving transistor 32 on the base 10 is located within an orthographic projection of the second metal light-shielding pattern 13 on the base 10, so that the second metal light-shielding pattern 13 may block light that travels toward the second active layer 324.

The plurality of second line segments 22 and the plurality of second metal light-shielding patterns 13 are disposed in a same layer and made of a same material, and the plurality of second line segments 22 are insulated from the plurality of second metal light-shielding patterns 13. The material of the second line segments 22 and the second metal light-shielding patterns 13 includes, for example, Mo, Al, or other materials having a light-shielding effect.

It will be noted that in a case where the plurality of second line segments 22 and the plurality of first metal light-shielding patterns 12 are arranged in a same layer, the plurality of second metal light-shielding patterns 13, the plurality of first metal light-shielding patterns 12, and the plurality of second line segments 22 are arranged in a same layer.

In some embodiments, as shown in FIG. 7, the second gates 321 of the driving transistors 32, the first gates 311 of the first switching transistors 31, and the gate lines 1 are disposed in a same layer and made of a same material. The second sources 322 and the second drains 323 of the driving transistors 32, the first sources 312 and the first drains 313 of the first switching transistors 31, and the first line segments 21 are disposed in a same layer and made of a same material.

In some embodiments, as shown in FIG. 7, one of the second source 322 and the second drain 323 of the driving transistor 32 is electrically connected to the second metal light-shielding pattern 13 located at the side of the driving transistor 32 proximate to the base 10 through a fourth via 86. In some embodiments, as shown in FIGS. 6 and 7, the display substrate 200 further includes a plurality of power lines 9 electrically connected to the plurality of pixel circuits 30. The power lines 9 extend in the first direction Y.

A power line 9 of the plurality of power lines 9 includes a plurality of third line segments 91 and a plurality of fourth line segments 92 that all extend in the first direction, and the plurality of third line segments 91 and the plurality of fourth line segments 92 are arranged alternately. For example, each power line 9 includes a plurality of third line segments 91 and a plurality of fourth line segments 92 that all extend in the first direction, and the plurality of third line segments 91 and the plurality of fourth line segments 92 are arranged alternately.

There is no overlap among orthographic projections of the plurality of third line segments 91 on the base 10 and the orthographic projections of the plurality of gate lines 1 on the base 10, and an orthographic projection of each fourth line segment 92 on the base 10 overlaps with an orthographic projection of a corresponding gate line 1 on the base 10. The plurality of third line segments 91 and the plurality of first line segments 21 are disposed in a same layer and made of a same material, and the plurality of fourth line segments 92 and the second line segments 22 are disposed in a same layer and made of a same material. The insulating layer 16 further includes a plurality of third vias 83. In the first direction Y, any two adjacent third line segments 91 are electrically connected to a fourth line segment 92 located between the two third line segments 91 through at least two third vias 83.

In some examples, the power line 9 is electrically connected to the second source 322 of the driving transistor 32 in the pixel circuit 30. In this case, in the pixel circuit 30 of the 2T1C structure, the second drain 323 of the driving transistor 32 is electrically connected to the light-emitting device 40.

In some other examples, as shown in FIG. 7, the power line 9 is electrically connected to the second drain 323 of the driving transistor 32 in the pixel circuit 30. In this case, in the pixel circuit 30 of the 2T1C structure, the second source 322 of the driving transistor 32 is electrically connected to the light-emitting device 40.

In some embodiments, in the second direction X, a width of the fourth line segment 92 is greater than a width of the third line segment 91, so as to ensure a pass rate of an electrical connection between the third line segment 91 and the fourth line segment 92. In a case where the second line segments 22, the first metal light-shielding patterns 12 and the second metal light-shielding patterns 13 are arranged in a same layer, the fourth line segments 92, the second line segments 22, the second metal light-shielding patterns 13, and the first metal light-shielding patterns 12 are arranged in a same layer.

In some embodiments, as shown in FIG. 7, the third line segments 91, the first line segments 21, the second sources 322 and the second drains 323 of the driving transistors 32, and the first sources 312 and the first drains 313 of the first switching transistors 31 are arranged in a same layer.

Similar to an arrangement manner of the data line 2, in the embodiments of the present disclosure, the power line 9 is divided into a plurality of third line segments 91 and a plurality of fourth line segments 92 in the first direction Y; the plurality of third line segments 91 are located at the side of the gate lines 1 away from the base 10, and the plurality of fourth line segments 92 are located at the side of the gate lines 1 proximate to the base 10; and a plurality of third vias 83 are provided in the insulating layer 16, so that in the first direction, any two adjacent third line segments 91 are electrically connected to a fourth line segment 92 located between the two adjacent third line segments 91 through at least two third vias 83, so that the plurality of third line segments 91 and the plurality of fourth line segments 92 in the first direction are electrically connected to form a single power line 9. In this case, even if a level difference of the insulating layer 16 is large, it may be possible to avoid a non-uniform thickness of the power line 9 caused by the level difference, and thus ensure a thickness uniformity of the power line 9 and improve the pass rate of the display panels.

In some embodiments, the power line 9 is electrically connected to the second source 322 of the driving transistor 32 in the pixel circuit 30, and the second drain 323 of the driving transistor 32 is electrically connected to the anode 41 of the light-emitting device 40.

In some examples, a material of the anode 41 includes ITO.

In some embodiments, the pixel circuit 30 further includes at least one second switching transistor, and the second switching transistor is a top-gate thin film transistor. In this case, a third metal light-shielding pattern may further be provided between the second switching transistor and the base 10. An orthographic projection of the third metal light-shielding pattern on the base 10 covers an orthographic projection of an active layer of the second switching transistor on the base 10. The third metal light-shielding patterns and the first metal light-shielding patterns 12 are disposed in a same layer and made of a same material, and the third metal light-shielding patterns are insulated from the first metal light-shielding patterns 12.

Some embodiments of the present disclosure further provide a method of manufacturing an array substrate. As shown in FIG. 16, the method includes following steps.

In S10, a plurality of second line segments 22 are formed on a base 10.

Referring to FIGS. 4 to 7, the base 10 is provided, and a plurality of columns of second line segments 22 are formed on the base 10 in a second direction X. Each column of second line segments 22 includes second line segments 22 extending in a first direction Y and arranged at intervals. The first direction intersects the second direction.

In some examples, the first direction is perpendicular to the second direction.

In some embodiments, after the plurality of second line segments 22 are formed, a plurality of pixel circuits 30 are formed on the base 10 on which the plurality of second line segments 22 have been formed.

The pixel circuit 30 includes a first switching transistor 31. As for a structure of the first switching transistor 31, reference may be made to the description about the structure of the first switching transistor 31 in the above embodiments, and details will not be repeated here.

Figure 17:
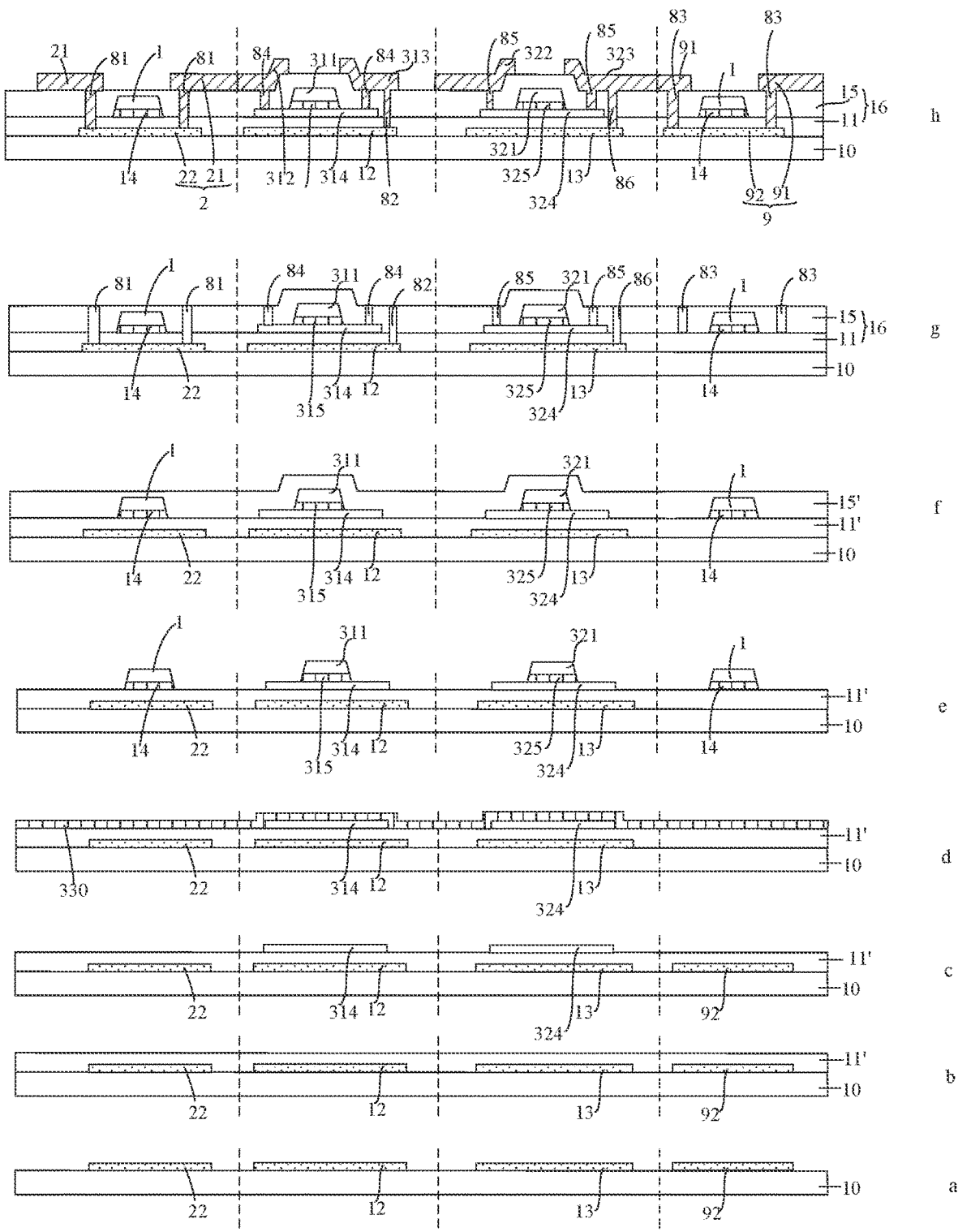
FIG. 17 is a schematic structural diagram illustrating a manufacturing process of an array substrate, in accordance with some embodiments of the present disclosure.

In some embodiments, as shown in part a in FIG. 17, a plurality of second line segments 22 and a plurality of first metal light-shielding patterns 12 are formed on the base 10 through a single patterning process. The plurality of second line segments 22 are insulated from the plurality of first metal light-shielding patterns 12. An orthographic projection of a first active layer 314 of the first switching transistor 31 on the base 10 is located within an orthographic projection of a corresponding first metal light-shielding pattern 12 on the base 10.

In some examples, the first metal light-shielding pattern 12 has a same thickness as the second line segment 22, so that in the subsequent step, when a buffer film 11' is formed on the first metal light-shielding patterns 12 and the second line segments 22, it may be possible to ensure a uniform thickness of the buffer film 11 in a thickness direction of the base 10.

In some embodiments, the pixel circuit 30 further includes a driving transistor 32. As shown in part a in FIG. 17, the plurality of second line segments 22, the plurality of first metal light-shielding patterns 12, and a plurality of second metal light-shielding patterns 13 may be formed on the base 10 through a single patterning process. The plurality of second line segments 22 are insulated from the plurality of first metal light-shielding patterns 12 and the plurality of second metal light-shielding patterns 13, and the plurality of first metal light-shielding patterns 12 are also insulated from the plurality of second metal light-shielding patterns 13. An orthographic projection of a second active layer 324 of the driving transistor 32 on the base 10 is located within an orthographic projection of a corresponding second metal light-shielding pattern 13 on the base 10.

The first metal light-shielding patterns 12, the second line segments 22, and the second metal light-shielding patterns 13 may have the same thickness.

In some examples, a material for the second line segments 22 includes Mo, Al, or other metal materials having a light-shielding effect. The first metal light-shielding patterns 12 and the second metal light-shielding patterns 13 may be made of the same material as the second line segments 22.

In S20, a plurality of gate lines 1 are formed on the base 10 on which the plurality of second line segments 22 have been formed, the plurality of gate lines 1 all extending in the second direction X.

Referring to FIGS. 4 to 7, the plurality of gate lines 1 arranged in the first direction Y are formed on the base 10 on which the plurality of second line segments 22 have been formed, and each gate line 1 extends in the second direction X.

In some embodiments, the plurality of gate lines 1 and the first gates 311 of the first switching transistors 31 are formed through a single patterning process.

In some other embodiments, the plurality of gate lines 1, the first gates 311 of the first switching transistors 31, and second gates 321 of the driving transistors 32 are formed through a single patterning process.

A material for the gate lines 1 may include, for example, at least one of Cu, Al, Mo, Ti, Cr, W, and other elemental metals.

In S30, an insulating layer 16 is formed on the base 10 on which the plurality of second line segments 22 have been formed, the insulating layer including a plurality of first vias 81.

Referring to FIGS. 5 and 7, the first vias 81 are used to electrically connect the second line segments 22 to first line segments 21 to be formed subsequently.

As shown in part g in FIG. 17, the first vias 81 expose partial regions of the second line segments 22.

In S40, a plurality of first line segments 21 are formed on the base 10 on which the insulating layer 16 has been formed.

As shown in FIGS. 4 to 7, there is no overlap among orthographic projections of the plurality of first line segments 21 on the base 10 and orthographic projections of the plurality of gate lines 1 on the base 10. The plurality of first line segments 21 are arranged into a plurality of columns in the second direction X, and first line segments 21 in each column extend in the first direction and are arranged at intervals. In the first direction Y, any two adjacent first line segments 21 are electrically connected to a second line segment 22 located between the two adjacent first line segments 21 through at least two first vias 81. All the first line segments 21 and all the second line segments 22 that are electrically connected in each column constitute a single data line 2.

In some embodiments, the plurality of first line segments 21 and first sources 312 and first drains 313 of the first switching transistors 31 may be formed through a single patterning process.

In some other embodiments, referring to part h in FIG. 17, the plurality of first line segments 21, the first sources 312 and the first drains 313 of the first switching transistors 31, and second sources 322 and second drains 323 of the driving transistors 32 may be formed through a single patterning process.

A material of the first line segments 21 may include, for example, Cu, Al, or other elemental metals.

In some embodiments, the insulating layer 16 includes a buffer layer 11 and an interlayer dielectric layer 15.

As shown in part b in FIG. 17, the buffer film 11' is formed on the base 10 after the plurality of second line segments 22 are formed and before the plurality of gate lines 1 are formed. The buffer film 11' may be of a single-layer or multi-layer structure. For example, the buffer film 11" is of a single-layer structure, and a material of the buffer film 11' is $SiO_x$ or $SiN_x$. The buffer film 11' may be of a two (or more)-layer structure, and the buffer film 11' is, for example, a composite film layer composed of a $SiO_x$ layer and a Sir % layer.

In some embodiments, the first active layers 314 of the first switching transistors 31 are formed on the buffer film 11' through a single patterning process.

In some other embodiments, as shown in part c in FIG. 17, the first active layers 314 of the first switching transistors 31 and the second active layers 324 of the driving transistors 32 are formed on the buffer film 11' through a single patterning process.

The buffer film 11' may prevent harmful impurities and ions in the base 10 from diffusing into the first active layers 314 of the first switching transistors 31 and the second active layers 324 of the driving transistors 32.

A material of the first active layers 314 of the first switching transistors 31 includes, for example, IGZO, IGO, ITZO, AlZnO, ZnO, GZO, or other metal oxides.

A material of the second active layers 324 of the driving transistors 32 includes, for example, IGZO, IGO, ITZO, AlZnO, ZnO, GZO, or other metal oxides.

In some embodiments, a gate insulating film is formed on the base 10 on which the first active layers 314 have been formed, and the gate insulating film is patterned with the first gates 311 and the gate lines 1 as a mask, so as to form first gate insulating patterns 315 of the first switching transistors 31 and remaining patterns 14. An orthographic projection of the remaining pattern 14 on the base 10 overlaps with the orthographic projection of the gate line 1 on the base 10.

In some other embodiments, referring to parts d and e in FIG. 17, a gate insulating film 330 is formed on the buffer film 11' on which the first active layers 314 and the second active layers 324 have been formed, and the gate insulating film 330 is patterned with the first gates 311, the second gates 321 and the gate lines 1 as a mask, so as to form first gate insulating patterns 315 of the first switching transistors 31, second gate insulating patterns 325 of the driving transistors 32, and remaining patterns 14. An orthographic projection of the remaining pattern 14 on the base 10 overlaps with the orthographic projection of the gate line 1 on the base 10.

Of course, after the gate insulating film 330 is formed, the gate insulating film 330 may not be patterned. In this case, the first gate insulating patterns 315, the second gate insulating patterns 325, and the remaining patterns 14 are of a one-piece structure.

A material for the gate insulating film 330 includes, for example, at least one of $SiN_x$, $SiO_x$, aluminum oxide ($Al_2O_3$), and aluminum nitride (AlN).

It can be understood that, after the first gates 311 and the first gate insulating patterns 315 of the first switching transistors 31 are formed, a conductorization treatment is performed on portions of the first active layers 314 of the first switching transistors 31 that are not covered by the first gates 311, so as to increase a conductivity of portions of the first active layers 314 that are in contact with the first sources 312 and the first drains 313. For example, the conductorization treatment may be performed by bombarding portions of the first active layers 314 of the first switching transistors 31 that extend beyond the first gates 311 with plasma, so as to bombard oxygen ions out and thus conductorize the portions of the first active layers 314. A gas forming the plasma includes a protective atmosphere or a reactive atmosphere. Protective gases may include, for example, one or a mixture of nitrogen, argon, helium, or neon. Reactive gases may include, for example, one or a mixture of air, oxygen, hydrogen, ammonia, or carbon dioxide.

Of course, after the second gates 321 and the second gate insulating patterns 325 of the driving transistors 32 are formed, the conductorization treatment is performed on portions of the second active layers 324 of the driving transistors 32 that are not covered by the second gates 321, so as to increase the conductivity of portions of the second active layers 324 that are in contact with the second sources 322 and the second drains 323.

When the conductorization treatment is performed on the portions of the first active layers 314 of the first switching transistors 31, the conductive treatment may be performed on the portions of the second active layers 324 of the driving transistors 32 that are not covered by the second gates 321 in the same manner. Referring to part f in FIG. 17, after the gate lines 1 are formed, an interlayer dielectric film 15" is formed on the buffer film 11' on which the gate lines 1 have been formed, and then the interlayer dielectric film 15' and the buffer film 11' are patterned to form, as shown in part g in FIG. 17, the interlayer dielectric layer 15 and the buffer layer 11. The first vias 81 penetrate the interlayer dielectric layer 15 and the buffer layer 11, so that in the first direction, any two adjacent first line segments 21 are electrically connected to a second line segment 22 located between the two adjacent first line segments 21 through at least two first vias 81.

In addition, in the process of forming the first vias 81, a plurality of first connection vias 84 penetrating the interlayer dielectric layer 15 are also formed, so that the first source 312 and the first drain 313 may each be in contact with the first active layer 314 through a first connection via 84.

Of course, in the process of forming the first vias 81, a plurality of first connection vias 84 and a plurality of second connection vias 85 penetrating the interlayer dielectric layer 15 are further formed. In this way, the first source 312 and the first drain 313 may each be in contact with the first active layer 314 through a first connection via 84, and the second source 322 and the second drain 323 may each be in contact with the second active layer 324 through a second connection via 85.

In some embodiments, in the process of forming the first vias 81, a plurality of second vias 82 penetrating the buffer layer 11 and the interlayer dielectric layer 15 are further formed. One of the first source 312 and the first drain 313 of the first switching transistor 31 is electrically connected to the first metal light-shielding pattern 12 through a second via 82.

In some other embodiments, in the process of forming the first vias 81, a plurality of second vias 82 and a plurality of fourth vias 86 penetrating the buffer layer 11 and the interlayer dielectric layer 15 are further formed. One of the first source 312 and the first drain 313 of the first switching transistor 31 is electrically connected to the first metal light-shielding pattern 12 through a second via 82. One of the second source 322 and the second drain 323 of the driving transistor 32 is electrically connected to the second metal light-shielding pattern 13 through a fourth via 86.

In some embodiments, the method of manufacturing the array substrate further includes forming a plurality of power lines, as shown in FIG. 14. Each power line 9 includes a plurality of third line segments 91 and a plurality of fourth line segments 92 that all extend in the first direction, and the plurality of third line segments 91 and the plurality of fourth line segments 92 are arranged alternately.

There is no overlap among orthographic projections of the plurality of third line segments 91 on the base 10 and the orthographic projections of the plurality of gate lines 1 on the base 10, and an orthographic projection of each fourth line segment 92 on the base 10 overlaps with an orthographic projection of a corresponding gate line 1 on the base 10. The plurality of third line segments 91 and the plurality of first line segments 21 are formed through a single patterning process, and the plurality of fourth line segments 92 and the second line segments 22 are formed through a single patterning process.

The insulating layer 16 further includes a plurality of third vias 83. In the first direction, any two adjacent third line segments 91 are electrically connected to a fourth line segment 92 located between the two third line segments 91 through at least two third vias 83.

In some examples, the power line 9 is electrically connected to the second source 322 of the driving transistor 32 in the pixel circuit 30.

It will be noted that, with regard to a specific structure of the power line 9, reference may be made to the structure of the power line 9 in the array substrate 200 described above, and details will not be repeated here.

The above descriptions are only specific implementations of the present disclosure, but the protection scope of the present disclosure is not limited thereto. Any person skilled in the art could readily conceive of changes or replacements within the technical scope of the present disclosure, which shall all be included in the protection scope of the present disclosure, Therefore, the protection scope of the present disclosure shall be subject to the protection scope of the claims.

What is claimed is:

1. An array substrate, comprising:
   a base, having a plurality of sub-pixel regions;
   a plurality of gate lines and a plurality of data lines disposed on the base, wherein the plurality of data lines all extend in a first direction, and the plurality of gate lines all extend in a second direction, the first direction intersecting the second direction;
   at least one of the plurality of data lines includes a plurality of first line segments and a plurality of second line segments that all extend in the first direction, the plurality of first lines segments and the plurality of second line segments being arranged alternately;
   the plurality of second line segments are disposed at a side of the plurality of gate lines proximate to the base, and the plurality of first line segments are disposed at a side of the plurality of gate lines away from the base; and
   orthographic projections of the plurality of first line segments on the base are non-overlapping with orthographic projections of the plurality of gate lines on the base;
   an insulating layer disposed between the plurality of first line segments and the plurality of second line segments, the insulating layer including a plurality of first vias, wherein in the first direction, any two adjacent first line segments are electrically connected to a second line segment located between the two adjacent first line segments through at least two first vias; and
   a plurality of pixel circuits disposed on the base, each pixel circuit being disposed in a sub-pixel region, and the pixel circuit being electrically connected to a gate line and a data line, wherein the pixel circuit includes a first switching transistor, a first gate of the first switching transistor and the gate line being disposed in a same layer and made of a same material, and a first source and a first drain of the first switching transistor and the plurality of first line segments being disposed in a same layer and made of a same material.

2. The array substrate according to claim 1, wherein in the second direction, a width of a second line segment in the plurality of second line segments is greater than a width of a first line segment connected to the second line segment.

3. The array substrate according to claim 1, wherein the first switching transistor is a top-gate thin film transistor; and the array substrate further comprises:
   a plurality of first metal light-shielding patterns disposed on the base, wherein each first metal light-shielding pattern is disposed at a side, proximate to the base, of a first switching transistor in a corresponding pixel circuit, and an orthographic projection of a first active layer of the first switching transistor in the corresponding pixel circuit on the base is located within an orthographic projection of the first metal light-shielding pattern on the base; and
   the plurality of second line segments and the plurality of first metal light-shielding patterns are disposed in a same layer and made of a same material, and the plurality of second line segments are insulated from the plurality of first metal light-shielding patterns.

4. The array substrate according to claim 3, wherein the insulating layer further includes a plurality of second vias, and one of a first source and a first drain of the first switching transistor is electrically connected to the first metal light-shielding pattern through at least one second via.

5. The array substrate according to claim 3, wherein in a thickness direction of the base, thicknesses of the plurality of second line segments are equal to thicknesses of the plurality of first metal light-shielding patterns.

6. The array substrate according to claim 1, further comprising:
   a plurality of pixel electrodes disposed on the base, each pixel electrode being disposed in a sub-pixel region, wherein the first source of the first switching transistor is electrically connected to the data line, the first drain of the first switching transistor is electrically connected to a pixel electrode, and the pixel electrode is disposed at a side of the first drain away from the base.

7. The array substrate according to claim 1, further comprising:
   a plurality of light-emitting devices disposed on the base, each light-emitting device being disposed in a sub-pixel region, and the light-emitting device being connected to a corresponding one of the plurality of pixel circuits.

8. The array substrate according to claim 7, wherein the pixel circuit further includes a driving transistor, the driving transistor being a top-gate thin film transistor; and the array substrate further comprises:

a plurality of second metal light-shielding patterns disposed on the base, wherein each second metal light-shielding pattern is disposed at a side, proximate to the base, of a driving transistor in a corresponding pixel circuit, and an orthographic projection of a second active layer of the driving transistor on the base is located within an orthographic projection of the second metal light-shielding pattern on the base; and the plurality of second line segments and the plurality of second metal light-shielding patterns are disposed in a same layer and made of a same material, and the plurality of second line segments are insulated from the plurality of second metal light-shielding patterns.

9. The array substrate according to claim 8, further comprising:

a plurality of power lines, wherein the plurality of power lines all extend in the first direction, and the pixel circuit is electrically connected to a power line;

a power line of the plurality of power lines includes a plurality of third line segments and a plurality of fourth line segments that all extend in the first direction, the plurality of third line segments and the plurality of fourth line segments being arranged alternately;

orthographic projections of the plurality of third line segments on the base are non-overlapping with the orthographic projections of the plurality of gate lines on the base;

the plurality of third line segments and the plurality of first line segments are disposed in a same layer and made of a same material, and the plurality of fourth line segments and the plurality of second line segments are disposed in a same layer and made of a same material;

the insulating layer further includes a plurality of third vias; and in the first direction, any two adjacent third line segments are electrically connected to a fourth line segment located between the two adjacent third line segments through at least two third vias.

10. The array substrate according to claim 9, wherein in the second direction, a width of a fourth line segment in the plurality of fourth line segments is greater than a width of a third line segment connected to the fourth line segment.

11. The array substrate according to claim 9, wherein the power line is electrically connected to a second source of a driving transistor in a corresponding pixel circuit, and a second drain of the driving transistor is electrically connected to an anode of a corresponding light-emitting device.

12. The array substrate according to claim 1, wherein the insulating layer includes a buffer layer and an interlayer dielectric layer that are stacked on the base.

13. A display device, comprising the array substrate according to claim 1.

* * * * *